(12) United States Patent
Ding et al.

(10) Patent No.: US 11,681,395 B2
(45) Date of Patent: Jun. 20, 2023

(54) DISPLAY SUBSTRATE, DISPLAY DEVICE AND DETECTION METHOD BY USING DISPLAY DEVICE

(71) Applicant: BOE TECHNOLOGY GROUP CO., LTD., Beijing (CN)

(72) Inventors: Xiaoliang Ding, Beijing (CN); Haisheng Wang, Beijing (CN); Yingming Liu, Beijing (CN); Pengpeng Wang, Beijing (CN); Likai Deng, Beijing (CN); Yangbing Li, Beijing (CN); Xueyou Cao, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 140 days.

(21) Appl. No.: 16/976,255

(22) PCT Filed: Oct. 23, 2019

(86) PCT No.: PCT/CN2019/112782
§ 371 (c)(1),
(2) Date: Aug. 27, 2020

(87) PCT Pub. No.: WO2021/077331
PCT Pub. Date: Apr. 29, 2021

(65) Prior Publication Data
US 2021/0124441 A1  Apr. 29, 2021

(51) Int. Cl.
*G06F 3/042* (2006.01)
*G06V 40/13* (2022.01)
(Continued)

(52) U.S. Cl.
CPC .......... *G06F 3/042* (2013.01); *G06V 40/1318* (2022.01); *H10K 59/12* (2023.02);
(Continued)

(58) Field of Classification Search
CPC ... G06F 3/042; G06V 40/1318; H01L 27/323; H01L 27/3234; H01L 27/3244;
(Continued)

(56) References Cited

U.S. PATENT DOCUMENTS

2011/0157110 A1   6/2011  Chou et al.
2013/0229499 A1*  9/2013  Zhao ................... G01B 11/24
                                              348/51

(Continued)

FOREIGN PATENT DOCUMENTS

CN   107480639 A   12/2017
CN   108735792 A   11/2018
(Continued)

*Primary Examiner* — Roberto W Flores
*Assistant Examiner* — Maheen I Javed

(57) ABSTRACT

Disclosed are a display substrate, a display device and a detection method by using a display device. The display substrate includes at least one sub-pixel, the at least one sub-pixel includes a first region and a second region, and the at least one sub-pixel includes a light emitting element which is arranged in the first region, and a pixel circuit structure and a photosensitive structure which are arranged in the second region; the pixel circuit structure and the photosensitive structure are stacked, and the photosensitive structure is closer to a light exiting side of the display substrate than the pixel circuit structure.

20 Claims, 3 Drawing Sheets

(51) Int. Cl.
*H10K 59/12* (2023.01)
*H10K 59/40* (2023.01)
*H10K 59/65* (2023.01)
*H10K 59/60* (2023.01)
*H01L 27/146* (2006.01)

(52) U.S. Cl.
CPC ............ *H10K 59/40* (2023.02); *H10K 59/60* (2023.02); *H10K 59/65* (2023.02); *H01L 27/14621* (2013.01); *H01L 27/14678* (2013.01)

(58) Field of Classification Search
CPC ......... H01L 27/14621; H01L 27/14678; H01L 27/3213; H01L 27/3227
See application file for complete search history.

(56) References Cited

U.S. PATENT DOCUMENTS

| | | | |
|---|---|---|---|
| 2015/0331508 A1* | 11/2015 | Nho | H01L 27/323 345/173 |
| 2016/0103359 A1* | 4/2016 | Kimura | G06F 3/042 349/33 |
| 2018/0019288 A1* | 1/2018 | Yang | H01L 27/1255 |
| 2018/0373915 A1* | 12/2018 | Ling | H01L 27/3227 |
| 2019/0340409 A1 | 11/2019 | Zhu et al. | |
| 2020/0044004 A1 | 2/2020 | Wang et al. | |
| 2022/0336769 A1* | 10/2022 | Bouthinon | H10K 59/1201 |

FOREIGN PATENT DOCUMENTS

| | | |
|---|---|---|
| CN | 109065582 A | 12/2018 |
| CN | 109509767 A | 3/2019 |
| CN | 110164847 A | 8/2019 |

* cited by examiner

DISPLAY SUBSTRATE, DISPLAY DEVICE AND DETECTION METHOD BY USING DISPLAY DEVICE

CROSS-REFERENCE TO RELATED APPLICATIONS

This application is the U.S. National Stage Entry of PCT/CN2019/112782, filed on Oct. 23, 2019, the entire disclosure of which is incorporated herein by reference as part of the disclosure of this application.

TECHNICAL FIELD

Embodiments of the present disclosure relate to a display substrate, a display device and a detection method by using a display device.

BACKGROUND

Organic light emitting diode (OLED) display panels have advantages of thin thickness, light weight, wide viewing angle, active luminescence, continuously adjustable luminescence color, low cost, fast response speed, low energy consumption, low driving voltage, wide working temperature range, simple production process, high luminous efficiency and flexible display, etc., and have been widely used in mobile phones, tablet computers, digital cameras and other display fields. At the same time, with the rapid development of display technology, touch panels have been widely used in people's life. At present, the touch panels can be divided into add on mode touch panels, on cell touch panels and in cell touch panels according to the composition structures thereof. Among them, the in cell touch panel is a structure in which a touch structure is arranged at the inner side of a display panel, which is beneficial to the lightness and thinness of the display panel.

SUMMARY

At least one embodiment of the present disclosure provides a display substrate, which includes: a base substrate and at least one sub-pixel arranged on the base substrate, the at least one sub-pixel including a first region and a second region, the at least one sub-pixel including a light emitting element which is arranged in the first region, and a pixel circuit structure and a photosensitive structure which are arranged in the second region; wherein the pixel circuit structure and the photosensitive structure are stacked, and the photosensitive structure is closer to a light exiting side of the display substrate than the pixel circuit structure; the photosensitive structure includes a photosensitive element and a switching transistor, the photosensitive element and the switching transistor are stacked and electrically connected to each other, and the photosensitive element is closer to the light exiting side of the display substrate than the switching transistor; the photosensitive element includes a first electrode and a second electrode, the first electrode is a transparent electrode, the second electrode is an opaque electrode, and the first electrode is closer to the light exiting side of the display substrate than the second electrode; and an orthographic projection of at least a channel region of the switching transistor on the base substrate is within an orthographic projection of the second electrode on the base substrate.

For example, in the display substrate provided by some embodiments of the present disclosure, the first electrode is a common electrode.

For example, in the display substrate provided by some embodiments of the present disclosure, an orthographic projection of at least a channel region of at least one transistor in the pixel circuit structure on the base substrate is within an orthographic projection of a source-drain metal layer where a source-drain electrode of the switching transistor is located on the base substrate.

For example, in the display substrate provided by some embodiments of the present disclosure, an orthographic projection of at least a channel region of at least one transistor in the pixel circuit structure on the base substrate is within an orthographic projection of the second electrode on the base substrate.

For example, in the display substrate provided by some embodiments of the present disclosure, the photosensitive element in the at least one sub-pixel includes at least one selected from the group consisting of an infrared light photosensitive element and a visible light photosensitive element.

For example, in the display substrate provided by some embodiments of the present disclosure, the photosensitive element includes the visible light photosensitive element, the display substrate further includes a filter layer arranged on one side of the visible light photosensitive element provided with the first electrode, and the filter layer is closer to the light exiting side of the display substrate than the first electrode; and the filter layer includes at least one selected from the group consisting of a red filter layer, a green filter layer and a blue filter layer.

For example, in the display substrate provided by some embodiments of the present disclosure, the light emitting element includes a third electrode and a fourth electrode, and the third electrode is closer to the light exiting side of the display substrate than the fourth electrode.

For example, in the display substrate provided by some embodiments of the present disclosure, a luminous color of the light emitting element is at least one selected from the group consisting of red, green, blue and infrared.

For example, in the display substrate provided by some embodiments of the present disclosure, the display substrate is a bottom emission type display substrate, and the photosensitive structure is at one side of the pixel circuit structure close to the base substrate.

At least one embodiment of the present disclosure further provides a display device, which includes: the display substrate according to any one of the embodiments of the present disclosure, and a package substrate cell-assembled with the display substrate.

For example, the display device provided by some embodiments of the present disclosure further includes: a control unit, a detection unit and a processing unit; wherein the control unit is configured to control on and off of the switching transistor; the detection unit is configured to detect an electrical signal generated by the photosensitive element in the case where the switching transistor is turned on; and the processing unit is configured to process the electrical signal detected by the detection unit to perform at least one selected from the group consisting of a touch detection operation, a fingerprint recognition operation and a fuzzy imaging operation.

For example, the display device provided by some embodiments of the present disclosure further includes: an infrared color resistance structure with a predetermined pattern, which is arranged at the light exiting side of the display substrate; and an infrared light source, arranged at one side of the infrared color resistance structure away from the display substrate, and arranged at a periphery of the infrared color resistance structure.

At least one embodiment of the present disclosure further provides a detection method by using a display device, wherein the display device includes a display substrate, the display substrate includes at least one sub-pixel, the at least one sub-pixel includes a first region and a second region, the at least one sub-pixel includes a light emitting element which is arranged in the first region, and a pixel circuit structure and a photosensitive structure which are arranged in the second region, wherein the pixel circuit structure and the photosensitive structure are stacked, and the photosensitive structure is closer to a light exiting side of the display substrate than the pixel circuit structure; and the detection method includes: performing at least one selected from the group consisting of a touch detection operation, a texture recognition operation and a fuzzy imaging operation, according to a light intensity change sensed by the photosensitive structure in the display substrate.

For example, in the detection method provided by some embodiments of the present disclosure, the photosensitive structure includes an infrared light photosensitive element, and the performing the touch detection operation according to the light intensity change sensed by the photosensitive structure includes: performing the touch detection operation, according to a light intensity change of infrared light in ambient light sensed by the infrared light photosensitive element before and after the display substrate is touched by an object.

For example, in the detection method provided by some embodiments of the present disclosure, the photosensitive structure includes an infrared light photosensitive element, the light emitting element in the display substrate includes an infrared light emitting element, and the performing the touch detection operation or the texture recognition operation according to the light intensity change sensed by the photosensitive structure includes: controlling the infrared light emitting element to emit infrared light; and performing the touch detection operation or the texture recognition operation, according to the light intensity change of reflected light corresponding to infrared light emitted by the infrared light emitting element and sensed by the infrared light photosensitive element before and after the display substrate is touched by an object.

For example, in the detection method provided by some embodiments of the present disclosure, the photosensitive structure includes an infrared light photosensitive element, the light emitting element in the display substrate includes an infrared light emitting element, and the performing the fuzzy imaging operation according to the light intensity change sensed by the photosensitive structure includes: controlling the infrared light emitting element to emit infrared light with different patterns; and performing the fuzzy imaging operation on an external scene based on a computational optical method, according to light intensity, sensed by the infrared light photosensitive element, of reflected infrared light obtained after the infrared light with different patterns is reflected by the external scene.

For example, in the detection method provided by some embodiments of the present disclosure, the photosensitive structure includes an infrared light photosensitive element, and the display device further includes: an infrared color resistance structure with a predetermined pattern, which is arranged at the light exiting side of the display substrate; and an infrared light source, arranged at one side of the infrared color resistance structure away from the display substrate, and arranged at a periphery of the infrared color resistance structure; the performing the fuzzy imaging operation according to the light intensity change sensed by the photosensitive structure includes: controlling the infrared light source to emit infrared light; and performing the fuzzy imaging operation on an external scene based on a computational optical method, according to light intensity, sensed by the infrared light photosensitive element, of reflected infrared light obtained after infrared light emitted by the infrared light source is reflected by the external scene and passes through the infrared color resistance structure.

For example, in the detection method provided by some embodiments of the present disclosure, the performing the fuzzy imaging operation according to the light intensity change sensed by the photosensitive structure further includes: continuously performing the fuzzy imaging operations on the external scene; and performing a floating touch detection operation or a floating motion recognition operation, according to a difference between continuous fuzzy imaging results.

For example, in the detection method provided by some embodiments of the present disclosure, the photosensitive structure includes a visible light photosensitive element, and the performing the touch detection operation or the texture recognition operation according to the light intensity change sensed by the photosensitive structure includes: inserting a detection cycle between adjacent display cycles, and during the detection cycle, controlling a plurality of sub-pixels of the display substrate to display a predetermined picture, and performing the touch detection operation or the texture recognition operation, according to the light intensity change of reflected light corresponding to the predetermined picture and sensed by the visible light photosensitive element before and after the display substrate is touched by an object.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
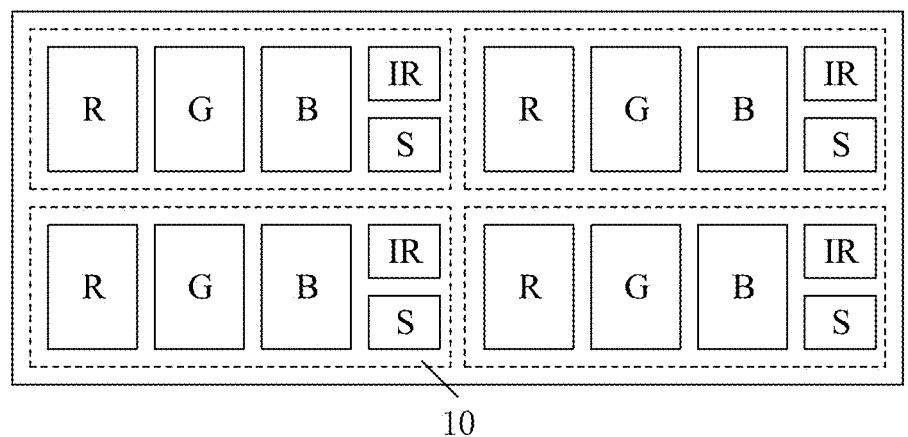
FIG. 1 is a schematic plan view of an optical touch display panel.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Similarly, similar words such as "a", "an" or "the" do not denote a limitation of quantity, but rather denote the presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "Upper", "lower", "left", "right", etc. are only used to indicate the relative positional relationship, and when the absolute position of the object to be described is changed, the relative positional relationship can also change accordingly.

The present disclosure is described below with reference to several specific embodiments. In order to keep the following description of the embodiments of the present disclosure clear and concise, detailed descriptions of known functions and known components or elements may be omitted. When any one component or element of an embodiment of the present disclosure appears in more than one of the accompanying drawings, the component or element is denoted by a same or similar reference numeral in each of the drawings.

Generally, touch technologies used in touch screens include capacitive touch technology and optical touch technology, etc. Among the numerous touch technologies, the capacitive touch technology is mainly based on the principle of capacitive sensing, and has the advantage of low cost, but also has the problem that capacitive touch control cannot be performed by using an insulator. On the other hand, optical touch technology is mainly based on the principle of reflection and refraction of light, and can realize the touch control by using an insulator or a conductor, but also has the problem that the aperture ratio of the display panel is reduced.

FIG. 1 is a schematic plan view of an optical touch display panel. As illustrated in FIG. 1, the optical touch display panel includes a plurality of pixel groups 10 arranged in an array (as illustrated by the dashed boxes in FIG. 1). For example, each pixel group 10 includes a red sub-pixel R, a green sub-pixel G, and a blue sub-pixel B, so that color display can be realized. For another example, each pixel group 10 further includes an infrared sub-pixel IR (which can emit infrared light) and infrared light photosensitive elements S, so that optical touch detection and fingerprint recognition can be realized. As illustrated in FIG. 1, in the optical touch display panel, the infrared sub-pixel IR and the infrared light photosensitive element S are arranged side by side with the red sub-pixel R, the green sub-pixel G and the blue sub-pixel B in the plane of the display panel, which will reduce the aperture ratio of the optical touch display panel and affect the display effect.

At least one embodiment of the present disclosure provides a display substrate. The display substrate includes at least one sub-pixel, the at least one sub-pixel includes a first region and a second region, and the at least one sub-pixel includes a light emitting element which is arranged in the first region, and a pixel circuit structure and a photosensitive structure which are arranged in the second region. The pixel circuit structure and the photosensitive structure are stacked, and the photosensitive structure is closer to the light exiting side of the display substrate than the pixel circuit structure.

Some embodiments of the present disclosure further provide a display device corresponding to the display substrate and a detection method by using the display device.

In the display substrate provided by the embodiments of the present disclosure, the photosensitive structure and the pixel circuit structure of the sub-pixel are stacked, so that the influence of the photosensitive structure on the aperture ratio of the display substrate can be reduced. Therefore, the display device including the display substrate can realize the functions such as touch detection, fingerprint recognition and fuzzy imaging, etc., and the display effect of the display device is basically not affected.

Some embodiments and examples of the present disclosure will be described in detail with reference to the accompanying drawings.

Figure 2:
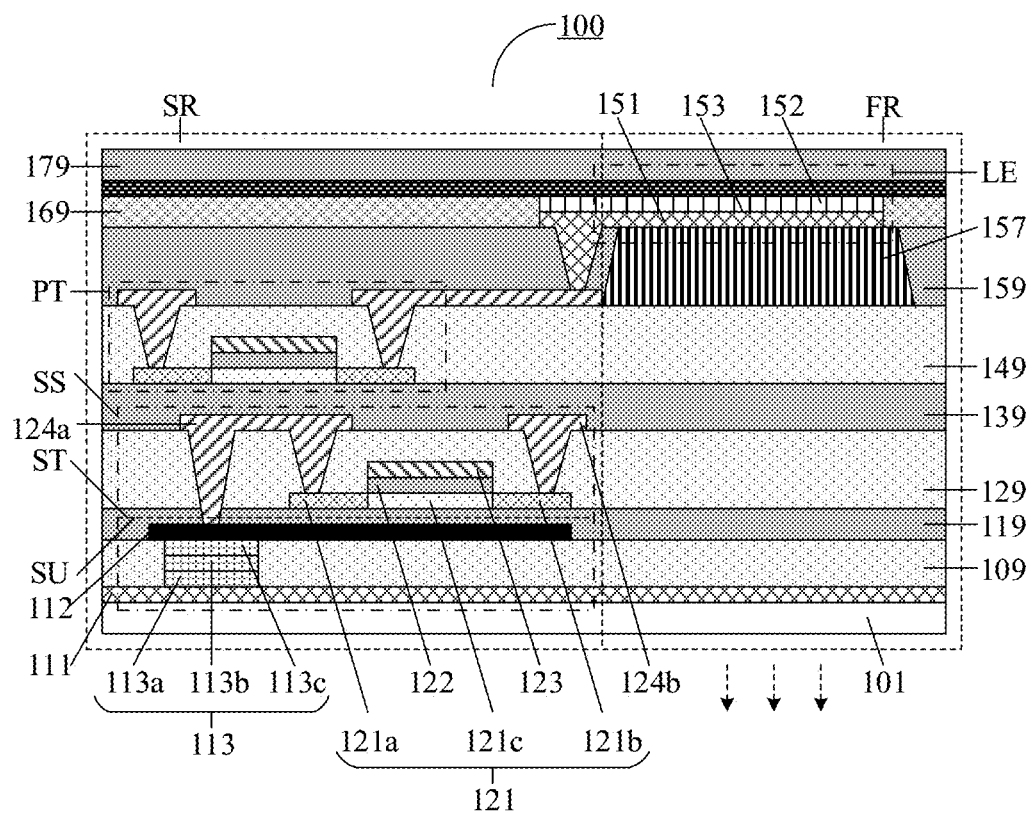
FIG. 2 is a schematic cross-sectional view of a sub-pixel of a display substrate according to at least one embodiment of the present disclosure.

FIG. 2 is a schematic cross-sectional view of a sub-pixel of a display substrate according to at least one embodiment of the present disclosure. For example, the display substrate 100 includes a base substrate 101 and a plurality of sub-pixels arranged in an array on the base substrate 101. For example, the plurality of sub-pixels can be all or part of the sub-pixels of the display substrate 100, without being limited in the embodiments of the present disclosure. For another example, the plurality of sub-pixels can include one or more selected from the group consisting of red sub-pixels, green sub-pixels and blue sub-pixels, without being limited in the embodiments of the present disclosure. It should be noted that the embodiments of the present disclosure have no special limitation on the number of sub-pixels, and for example, at least one sub-pixel can be included. In addition, besides the structure of sub-pixels described with reference to FIG. 2, other types or structures of sub-pixels can also be included, without being limited in the embodiments of the present disclosure.

For example, as illustrated in FIG. 2, each sub-pixel in the plurality of sub-pixels includes a first region FR (as illustrated by a dashed box FR in FIG. 2) and a second region SR (as illustrated by a dashed box SR in FIG. 2), and each sub-pixel includes a light emitting element LE (as illustrated by a dashed box LE in FIG. 2) which is arranged in the first region FR, and a pixel circuit structure PT (as illustrated by a dashed box PT in FIG. 2) and a photosensitive structure SS (as illustrated by a dashed box SS in FIG. 2) which are arranged in the second region SR. It should be noted that for clarity and conciseness, only one transistor in the pixel circuit structure PT is illustrated in FIG. 2, that is, a specific structure of the pixel circuit structure PT can also include more transistors and capacitors, etc., without being limited in the embodiments of the present disclosure.

For example, as illustrated in FIG. 2, the pixel circuit structure PT and the photosensitive structure SS are stacked on the base substrate 101 (for example, stacked in a direction perpendicular to the base substrate 101), and the photosensitive structure SS is closer to the light exiting side of the display substrate 100 than the pixel circuit structure PT. For example, the display substrate 100 illustrated in FIG. 2 is a bottom emission type display substrate, and the base substrate 101 thereof can be a transparent substrate, for example, including but not limited to a glass substrate; therefore, when the display substrate 100 is displaying, the display picture of the display substrate 100 is presented through the base substrate 101, that is, in the display substrate 100, the side at which the base substrate 101 is located is the light exiting side of the display substrate 100 (i.e., the side at which the dashed arrow is located in FIG. 2). For example, as illustrated in FIG. 2, the photosensitive structure SS can be firstly formed on the base substrate 101, and then the pixel circuit structure PT can be formed on the photosensitive structure SS, so that the pixel circuit structure PT and the photosensitive structure SS are stacked, and the photosensitive structure SS is closer to the light exiting side of the display substrate 100 than the pixel circuit structure PT. For example, the photosensitive structure SS is located at one side of the pixel circuit structure PT close to the base substrate 101. It should be noted that the display substrate provided by the embodiments of the present disclosure is not limited to a bottom emission type display substrate, but can also include a top emission type display substrate. For example, in a top emission type display substrate, the base substrate thereof can be an opaque substrate, and a pixel circuit structure can be firstly formed on the opaque substrate, and then a photosensitive structure can be formed on the pixel circuit structure, so that the pixel circuit structure and the photosensitive structure are stacked, and the photosensitive structure is closer to the light exiting side of the display substrate than the pixel circuit structure. For example, in the case of a top emission type display substrate, the photosensitive structure is located at one side of the pixel circuit structure away from the base substrate. It should be noted that, the following description is illustrated by taking that the display substrate is a bottom emission type display substrate shown in FIG. 2 as an example, but this does not constitute a limitation to the embodiments of the present disclosure.

For example, as illustrated in FIG. 2, the photosensitive structure SS includes a photosensitive element SU and a switching transistor ST (referring to the division of the dashed line in the dashed box SS of FIG. 2). The photosensitive element SU and the switching transistor ST are stacked and electrically connected to each other, and the photosensitive element SU is closer to the light exiting side of the display substrate than the switching transistor ST. For example, as illustrated in FIG. 2, the photosensitive element SU can be firstly formed on the base substrate 101, and then the switching transistor ST can be formed on the photosensitive element SU, so that the photosensitive element SU and the switching transistor ST are stacked, and the photosensitive element SU is closer to the light exiting side of the display substrate 100 than the switching transistor ST.

For example, the photosensitive element SU can include a photodiode, such as an infrared photodiode or a visible light photodiode, etc. For example, as illustrated in FIG. 2, the photosensitive element SU includes a first electrode 111, a second electrode 112, and a PIN structure 113 arranged between the first electrode 111 and the second electrode 112. For example, as illustrated in FIG. 2, the first electrode 111, the PIN structure 113 and the second electrode 112 are sequentially formed on the base substrate 101. For example, as illustrated in FIG. 2, the PIN structure 113 can include a p-type semiconductor material layer 113*a*, an intrinsic semiconductor material layer 113*b*, and an n-type semiconductor material layer 113*c*, which are sequentially arranged. For example, the PIN structure 113 can sense light irradiated onto the PIN structure 113 to generate an electrical signal.

For example, the first electrode 111 is a transparent electrode. For example, the material of the first electrode 111 can include a transparent conductive oxide, etc., such as at least one selected from the group consisting of indium tin oxide, indium zinc oxide, zinc oxide, indium oxide and indium gallium oxide, or any combination thereof, without being limited in the embodiments of the present disclosure. For example, the first electrode 111 is closer to the light exiting side of the display substrate 100 than the second electrode 112, so that the photosensitive element SU can sense the light beams passing through the first electrode 111 and reaching the PIN structure 113. For example, the first electrodes 111 of the plurality of sub-pixels forms a common electrode, that is, the first electrode 111 is not only formed in the second region SR, but also extends to the first region FR, thereby forming an entire surface electrode.

For example, the second electrode 112 is an opaque electrode. For example, the material of the second electrode 112 can include a metal material, etc., such as at least one selected from the group consisting of gold, silver, copper, aluminum, molybdenum, gold alloy, silver alloy, copper alloy, aluminum alloy, molybdenum alloy, etc., or any combination thereof, without being limited in the embodiments of the present disclosure. For example, in the second region SR, the second electrode 112 can extend in a direction pointing to the first region FR to block the light emitted by the light emitting element LE, thereby preventing the light emitted by the light emitting element LE from directly irradiating (without being reflected by external objects) on the PIN structure 113.

For example, as illustrated in FIG. 2, the switching transistor ST includes an active layer 121, a gate insulating layer 122, a gate electrode 123, and source-drain electrodes (124*a* and 124*b*). For example, the active layer 121 includes source-drain regions (121*a* and 121*b*) and a channel region 121*c*, the gate insulating layer 122 covers the channel region 121*c*, and the gate electrode 123 is located on the side of the gate insulating layer 122 away from the active layer 121. For example, in some examples, the orthographic projection of at least the channel region 121*c* of the switching transistor ST on the base substrate 101 falls within the orthographic projection of the second electrode 112 on the base substrate 101, so that the second electrode 112 can prevent external light from irradiating on the channel region of the switching transistor ST. For example, in some examples, the orthographic projection of the active layer 121 of the switching transistor ST on the base substrate 101 falls within the orthographic projection of the second electrode 112 on the base substrate 101, so that the second electrode 112 can prevent external light from irradiating on the active layer 121 of the switching transistor ST.

For example, as illustrated in FIG. 2, the display substrate 100 further includes a zeroth insulating layer 109, a first insulating layer 119 and a second insulating layer 129. The zeroth insulating layer 109 is arranged on the side of the first electrode 111 of the photosensitive element SU away from the base substrate 101, the PIN structure 113 of the photosensitive element SU is arranged in a through hole of the zeroth insulating layer 109, and the second electrode 112 of the photosensitive element SU covers the PIN structure 113 and part or all of the zeroth insulating layer 109 located in the second region SR. The first insulating layer 119 is arranged between the second electrode 122 of the photosensitive element SU and the active layer of the switching transistor ST, and covers the second electrode 122 of the photosensitive element SU. The second insulating layer 129 is located on the side of the first insulating layer 119 away from the base substrate 101, and covers the gate electrode 123 and the active layer 121 (the source-drain regions of the active layer 121) of the switching transistor ST. The source-drain electrodes 124a and 124b of the switching transistor are respectively connected to the source-drain regions 121a and 121b of the active layer 121 via through holes penetrating through the second insulating layer 129.

For example, as illustrated in FIG. 2, the source-drain electrode 124a of the switching transistor is further connected to the second electrode 112 of the photosensitive element SU via a through hole penetrating through the second insulating layer 129 and the first insulating layer 119, so that the photosensitive element SU and the switching transistor ST are electrically connected to each other.

For example, as illustrated in FIG. 2, the pixel circuit structure PT can include transistors, and the specific structure and arrangement of the transistors in the pixel circuit structure PT can be referred to the specific structure and arrangement of the switching transistor, and can also be referred to the specific structure and arrangement of transistors in common display panels, and details will not be described here.

For example, in some examples, as illustrated in FIG. 2, the orthographic projection of at least the channel region of at least one transistor in the pixel circuit structure PT on the base substrate 101 falls within the orthographic projection of the source-drain metal layer where the source-drain electrodes (e.g., 124a) of the switching transistor ST are located on the base substrate 101. Therefore, the source-drain metal layer of the switching transistor ST can prevent external light from irradiating on at least the channel region of the at least one transistor in the pixel circuit structure PT.

For example, in some other examples, as illustrated in FIG. 2, the orthographic projection of at least the channel region of at least one transistor in the pixel circuit structure PT on the base substrate 101 falls within the orthographic projection of the second electrode 112 on the base substrate 101. Therefore, the second electrode 112 can also prevent external light from irradiating on at least the channel region of the at least one transistor in the pixel circuit structure PT.

For example, as illustrated in FIG. 2, the display substrate 100 further includes a third insulating layer 139 and a fourth insulating layer 149. The third insulating layer 139 is arranged between the switching transistor ST and the pixel circuit structure PT, and can play a planarization role. The fourth insulating layer 149 is located on the side of the third insulating layer 139 away from the base substrate 101, and covers the gate electrode and the active layer of the transistor in the pixel circuit structure PT. The source-drain electrodes of the transistor in the pixel circuit structure PT are correspondingly connected to the source-drain regions of the active layer of the transistor in the pixel circuit structure PT via through holes penetrating through the fourth insulating layer 149.

For example, as illustrated in FIG. 2, the light emitting element LE includes a third electrode 151, a fourth electrode 152, and a light emitting functional layer 153 arranged between the third electrode 151 and the fourth electrode 152. For example, as illustrated in FIG. 2, the third electrode 151, the light emitting functional layer 153 and the fourth electrode 152 are sequentially formed on the base substrate 101.

For example, the third electrode 151 is a transparent electrode. For example, the material of the third electrode 151 can include a transparent conductive oxide, etc., such as at least one selected from the group consisting of indium tin oxide, indium zinc oxide, zinc oxide, indium oxide and indium gallium oxide, or any combination thereof, without being limited in the embodiments of the present disclosure. For example, the third electrode 151 is closer to the light exiting side of the display substrate 100 than the fourth electrode 152.

For example, the fourth electrode 152 is an opaque electrode. For example, the material of the second electrode 112 can include a metal material, etc., such as at least one selected from the group consisting of gold, silver, copper, aluminum, molybdenum, gold alloy, silver alloy, copper alloy, aluminum alloy, molybdenum alloy, etc., or any combination thereof, without being limited in the embodiments of the present disclosure. For example, the fourth electrode 152 of the plurality of sub-pixels forms a common electrode, that is, the fourth electrode 152 is not only formed in the first region FR, but also extends to the second region SR, thereby forming an entire surface electrode.

For example, the first electrode 111 and the fourth electrode 152 are both surface electrodes, so that interference of external electromagnetic noise to components in the display substrate 100 can be shielded. For example, at least one of the first electrode 111 or the fourth electrode 152 is located in the first region FR and second region SR described above.

For example, the light emitting functional layer 153 can include, but is not limited to, an organic light emitting layer, an inorganic light emitting layer or a quantum dot light emitting layer, etc. For example, in the case where the light emitting functional layer 153 includes an organic light emitting layer, the light emitting functional layer can further include one or more selected from the group consisting of a hole injection layer, a hole transport layer, an electron injection layer and an electron transport layer, without being limited in the embodiments of the present disclosure.

For example, as illustrated in FIG. 2, the display substrate 100 further includes a fifth insulating layer 159 and a sixth insulating layer 169. The fifth insulating layer 159 is arranged on the side of the fourth insulating layer 149 away from the base substrate 101 and covers the pixel circuit structure PT, and the sixth insulating layer 169 is arranged on the side of the fifth insulating layer 159 away from the base substrate 101. For example, the first electrode 151 and the light emitting functional layer 153 of the light emitting element LE are located in an opening of the sixth insulating layer 169, that is, the sixth insulating layer 169 has an opening to define a light emitting region of the light emitting element LE. For example, the first electrode 151 of the light emitting element LE is connected to the source-drain electrode of the transistor in the pixel circuit structure PT via a through hole penetrating through the fifth insulating layer 159, so that the pixel circuit structure PT can control and drive the light emitting element LE to emit light.

For example, as illustrated in FIG. 2, the display substrate 100 further includes a seventh insulating layer 179. The seventh insulating layer 179 is arranged on the side of the fourth electrode 152 of the light emitting element LE away from the base substrate 101, so as to protect the components in the display substrate 100 from corrosion by water vapor, oxygen and the like in the environment.

It should be noted that the display substrate 100 illustrated in FIG. 2 is illustrative, and the embodiments of the present disclosure do not limit the specific structure of each component in the display substrate, as long as the relative positions of the pixel circuit structure, the photosensitive structure and the light emitting element in the display substrate are set as described above. That is to say, the pixel circuit structure and the photosensitive structure are stacked, and the photosensitive structure is closer to the light exiting side of the display substrate than the pixel circuit structure, and the pixel circuit structure and the photosensitive structure do not affect the light emitting element for display.

For example, in the display substrate 100 illustrated in FIG. 2, the luminous color of the light emitting element LE can be at least one selected from the group consisting of red, green, blue and infrared. For example, in some examples, the display substrate 100 illustrated in FIG. 2 includes only red sub-pixels, green sub-pixels and blue sub-pixels for display. For example, in some other examples, the display substrate 100 illustrated in FIG. 2 can further include infrared sub-pixels (referring to FIG. 1). It should be noted that, different from the optical touch display panel illustrated in FIG. 1, in the display substrate 100 illustrated in FIG. 2, the photosensitive structure is stacked with the pixel circuit structure of the sub-pixel, so that the influence of the photosensitive structure on the aperture ratio of the display substrate 100 can be reduced.

For example, in some examples, the luminous color of the light emitting element LE can be white. In this case, as illustrated in FIG. 2, the display substrate 100 can further include a color film layer 157. The color film layer 157 is arranged on one side of the light emitting element LE close to the light exiting side of the display substrate 100, for example, arranged in an opening of the fifth insulating layer 159 (as illustrated in FIG. 2). For example, the color film layer can include a red color film layer, a green color film layer and a blue color film layer to respectively convert white light emitted by the light emitting element LE into red light, green light and blue light. For example, the color film layer can further include an infrared color film layer to convert white light emitted by the light emitting element LE into infrared light.

It should be noted that, in the embodiments of the present disclosure, the photosensitive structures can be arranged in all of the sub-pixels or in part of the sub-pixels. For example, in the case where the photosensitive structures are arranged in part of the sub-pixels, the part of sub-pixels can include sub-pixel of only one color or sub-pixels of multiple color, without being limited in the embodiments of the present disclosure.

For example, in some examples, the photosensitive elements SU in the plurality of sub-pixels can include at least one selected from the group consisting of an infrared light photosensitive element and a visible light photosensitive element. For example, the infrared light photosensitive element can sense infrared light, and the visible light photosensitive element can sense visible light. For example, in the case where the photosensitive element SU includes a visible light photosensitive element, the display substrate 100 can further include a filter layer (not illustrated in FIG. 2). The filter layer is arranged on one side of the visible light photosensitive element provided with the first electrode 111, and the filter layer is closer to the light exiting side of the display substrate 100 than the first electrode 111. For example, the arrangement of the filter layer relative to the visible light photosensitive element can be referred to the arrangement of the color film layer 157 relative to the light emitting element LE in FIG. 2, and details will not be described here. For example, the filter layer can include at least one selected from the group consisting of a red filter layer, a green filter layer and a blue filter layer. The red filter layer can only allow red light to pass through the red filter layer and reach the visible light photosensitive element, that is, the visible light photosensitive element provided with the red filter layer only senses red light. The functions of the green filter layer and the blue filter layer are similar to that of red filter layer, that is, the visible light photosensitive element provided with the green filter layer only senses green light, and the visible light photosensitive element provided with the blue filter layer only senses blue light.

Figure 3:
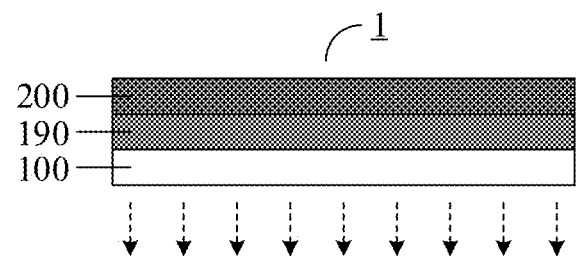
FIG. 3 is a schematic diagram of a display device according to at least one embodiment of the present disclosure.

At least one embodiment of the present disclosure further provides a display device. FIG. 3 is a schematic diagram of a display device according to at least one embodiment of the present disclosure. For example, as illustrated in FIG. 3, the display device 1 includes a display substrate 100 provided by any one of the above embodiments of the present disclosure (e.g., the display substrate 100 illustrated in FIG. 2), and a package substrate 200 cell-assembled with the display substrate 100. The package substrate 200 is arranged on one side opposite to the display side of the display substrate 100, and the display side of the display substrate 100 is the side at which the dashed arrow in FIG. 3 is located.

For example, as illustrated in FIG. 3, the display device 1 further includes an adhesive layer 190 arranged between the display substrate 100 and the package substrate 200. The adhesive layer 190 is used for bonding the display substrate 100 and the package substrate 200.

Figure 4:
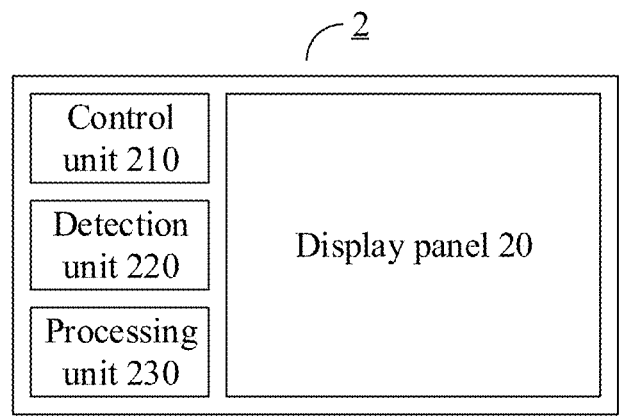
FIG. 4 is a schematic block diagram of a display device according to at least one embodiment of the present disclosure.

FIG. 4 is a schematic block diagram of a display device provided by at least one embodiment of the present disclosure. For example, as illustrated in FIG. 4, the display device 2 includes a display panel 20. For example, the structure of the display panel 20 can be referred to the structure of the display device 1 (e.g., including the display substrate 100 illustrated in FIG. 2, etc.), and details will not be described here.

For example, as illustrated in FIG. 4, the display device 2 further includes a control unit 210, a detection unit 220, and a processing unit 230. The control unit 210 is configured to control on and off of the switching transistor ST of the display substrate 100. The detection unit 220 is configured to detect an electrical signal generated by the photosensitive element SU in the case where the switching transistor ST is turned on. The processing unit 230 is configured to process the electrical signal detected by the detection unit 220 to perform at least one selected from the group consisting of a touch detection operation, a fingerprint recognition operation and a fuzzy imaging operation.

For example, the control unit 210 can be implemented as an integrated circuit driver chip being bonded, and can also be directly integrated on the display panel 20 (e.g., on the display substrate of the display panel 20) in the form of a control circuit. For example, the detection unit 220 can be implemented as an integrated circuit driver chip being bonded, and can also be directly integrated on the display panel 20 (e.g., on the display substrate of the display panel 20) in the form of a detection circuit. For example, the processing unit 230 can be implemented as a unit with data processing capability and/or program execution capability, such as a central processing unit (CPU), a tensor processing unit (TPU) or a graphics processing unit (GPU), etc.

Figure 5:
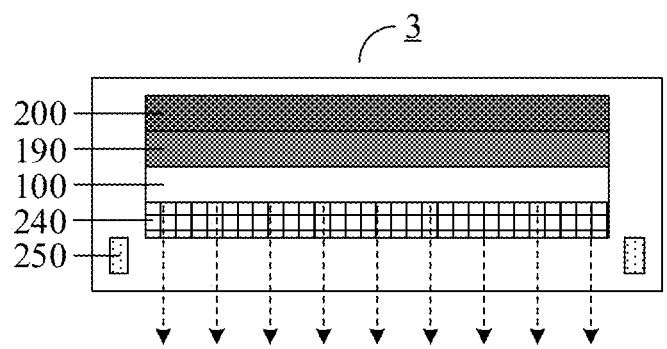
FIG. 5 is a schematic diagram of another display device according to at least one embodiment of the present disclosure.

FIG. 5 is a schematic diagram of another display device provided by at least one embodiment of the present disclosure. For example, on the basis of the display device 1, the display device 3 further includes an infrared color resistance structure 240 with a predetermined pattern and an infrared light source 250.

Figure 6:
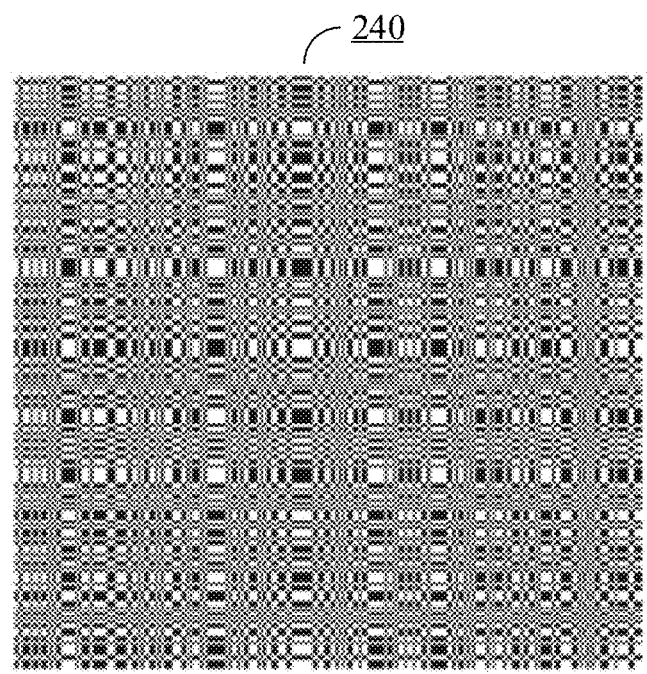
FIG. 6 is a schematic diagram of an infrared color resistance structure with a predetermined pattern according to at least one embodiment of the present disclosure.

FIG. 6 is a schematic diagram of an infrared color resistance structure with a predetermined pattern according to at least one embodiment of the present disclosure. For example, as illustrated in FIG. 6, the infrared color resistance structure 240 includes a plurality of color resistance regions (as illustrated by black squares in FIG. 6) and a plurality of hollow regions (as illustrated by white squares in FIG. 6). The color resistance region includes an infrared color resistance material which can block the transmission of infrared light, and the infrared color resistance material is transparent to visible light (i.e., only infrared light is filtered out). The hollow region allows infrared light and visible light to pass through. For example, the plurality of color resistance regions and the plurality of hollow regions form a predetermined pattern as illustrated in FIG. 6. It should be noted that the predetermined pattern of the infrared resistance structure 240 includes but is not limited to the predetermined pattern illustrated in FIG. 6, and can be referred to the mask pattern in the computational optical imaging technology, and details will not be described here.

For example, as illustrated in FIG. 5, the infrared color resistance structure 240 is arranged at the light exiting side of the display substrate 100 (i.e., the side at which the dashed arrow is located in FIG. 5). For example, as illustrated in FIG. 5, the infrared light source 250 is arranged at one side of the infrared color resistance structure 240 away from the display substrate 100 and arrange at the periphery of the infrared color resistance structure 240.

It should be noted that the arrangement of the infrared color resistance structure 240 and the infrared light source 250 in the display device 3 does not affect the normal display of the display device 3.

For example, the display device 3 can further include a control unit, a detection unit, and a processing unit, and specific details can be referred to the display device 2 illustrated in FIG. 4, and will not be described here.

For example, the above-mentioned display devices 1-3 can further include components for realizing the display function, such as data signal lines, scan signal lines, data driving circuits and scan driving circuits, etc. These components can adopt conventional components or structures, and the arrangement manners of these components can adopt conventional arrangement manners, and details will not be described here.

For example, the display device provided by the above embodiments of the present disclosure can be any product or component with display function, such as a display panel, a display, a television, an electronic paper display device, a mobile phone, a tablet computer, a notebook computer, a digital photo frame, a navigator, etc. It should be noted that the above display device can further include other conventional components or structures. For example, in order to realize necessary functions of the display device, those skilled in the art can set other conventional components or structures according to specific application scenarios, which is not limited by the embodiments of the present disclosure.

Technical effects of the display device provided by the embodiments of the present disclosure can be referred to the related description of the display substrate in the above embodiments, and details will not be described here.

At least one embodiment of the present disclosure further provides a detection method by using a display device. For example, the display device is the display device provided by any one of the above embodiments. For example, the display device includes a display substrate, the display substrate includes a plurality of sub-pixels arranged in an array, each sub-pixel in the plurality of sub-pixels includes a first region and a second region, and each sub-pixel in the plurality of sub-pixels includes a light emitting element which is arranged in the first region, and a pixel circuit structure and a photosensitive structure which are arranged in the second region, wherein the pixel circuit structure and the photosensitive structure are stacked, and the photosensitive structure is closer to the light exiting side of the display substrate than the pixel circuit structure. For example, the display device and the display substrate in the present embodiment can be referred to the related description of the display device and the display substrate in the above embodiments, and details will not be described here.

For example, the detection method by using the display device includes: performing at least one selected from the group consisting of a touch detection operation, a texture recognition operation and a fuzzy imaging operation, according to a light intensity change sensed by the photosensitive structure in the display substrate. Hereinafter, the detection method by using the display device to realize the touch detection operation, the texture recognition operation and the fuzzy imaging operation will be described in detail.

For example, in the display device provided by some examples (for example, referring to the display device 1 illustrated in FIG. 3), the photosensitive structure of the display substrate (for example, referring to the display substrate 100 illustrated in FIG. 2) includes an infrared light photosensitive element. Therefore, the performing the touch detection operation according to the light intensity change sensed by the photosensitive structure includes: performing the touch detection operation, according to a light intensity change of infrared light in ambient light sensed by the infrared light photosensitive element before and after the display substrate is touched by an object. For example, before the display substrate is touched by an object, the light intensity of infrared light in the ambient light sensed by the infrared light photosensitive element basically remains unchanged or changes slowly and continuously. While at the moment when the display substrate is touched by an object, the infrared light in the ambient light is blocked by the object, so that the light intensity of infrared light in the ambient light sensed by the infrared light photosensitive element at the touch position will change suddenly. Therefore, the photosensitive structure can realize the touch detection operation according to the light intensity change sensed by the photosensitive structure.

For example, in the display device provided by some examples (for example, referring to the display device 1 illustrated in FIG. 3), the photosensitive structure of the display substrate (for example, referring to the display substrate 100 illustrated in FIG. 2) includes an infrared light photosensitive element, and the light emitting element in the display substrate includes an infrared light emitting element. Therefore, the performing the touch detection operation or the texture recognition operation according to the light intensity change sensed by the photosensitive structure includes: controlling the infrared light emitting element to emit infrared light; and performing the touch detection operation or the texture recognition operation, according to the light intensity change of reflected light corresponding to infrared light emitted by the infrared light emitting element and sensed by the infrared light photosensitive element before and after the display substrate is touched by an object. For example, the infrared light emitting element periodically emits infrared light pulses; before the display substrate is touched by an object, the infrared light photosensitive element can only sense infrared light in ambient light; after the display substrate is touched by an object, the infrared light pulses emitted by the infrared light emitting element are reflected by the object, so that the infrared light photosensitive element at the touch position can sense the reflected infrared light pulses; an electrical signal generated by the infrared light photosensitive element after sensing an infrared light pulse has a pulse shape (corresponding to the pulse shape of the infrared light pulse emitted by the infrared light emitting element), while an electrical signal generated by the infrared light photosensitive element after sensing infrared light in ambient light does not have a corresponding pulse shape, and therefore, the photosensitive structure can realize the touch detection operation according to the light intensity change sensed by the photosensitive structure itself. For example, further, in the case where the touch surface of an object (e.g., a finger or a palm, etc.) includes a texture (e.g., fingerprint or palmprint, etc.), infrared light pulses reflected by ridges and valleys in the texture of the object can be sensed by a plurality of infrared light photosensitive elements at the touch position, and the photosensitive structure can also realize the texture recognition operation (e.g., the fingerprint recognition operation or the palmprint recognition operation, etc.) according to the light intensity differences of infrared light pulses sensed by the plurality of infrared light photosensitive elements at the touch position.

For example, in the display device provided by some examples (for example, referring to the display device 1 illustrated in FIG. 3), the photosensitive structure of the display substrate (for example, referring to the display substrate 100 illustrated in FIG. 2) includes an infrared light photosensitive element, and the light emitting element in the display substrate includes an infrared light emitting element. Therefore, the performing the fuzzy imaging operation according to the light intensity change sensed by the photosensitive structure includes: controlling the infrared light emitting element to emit infrared light with different patterns; performing the fuzzy imaging operation on an external scene based on a computational optical method, according to light intensity, sensed by the infrared light photosensitive element, of reflected infrared light obtained after the infrared light with different patterns is reflected by the external scene. For example, specific details of the fuzzy imaging operation using the display device can be referred to the common computational optical imaging method, without being limited in the embodiments of the present disclosure. For example, the performing the fuzzy imaging operation according to the light intensity change sensed by the photosensitive structure further includes: continuously performing the fuzzy imaging operations on the external scene; and performing a floating touch detection or a floating motion recognition, according to the difference between the continuous fuzzy imaging results. For example, the external scene includes a human hand, and the floating touch detection operation or the floating motion recognition includes detecting or recognizing motions or gestures, such as clicking, sliding, swinging, etc., by using the human hand. The embodiments of the present disclosure include but are not limited to these cases.

For example, in the display device provided by some examples (for example, referring to the display device 3 illustrated in FIG. 5), the photosensitive structure of the display substrate (for example, referring to the display substrate 100 illustrated in FIG. 2) includes an infrared light photosensitive element. The display device further includes: an infrared color resistance structure with a predetermined pattern, which is arranged at the light exiting side of the display substrate; and an infrared light source, which is arranged at one side of the infrared color resistance structure away from the display substrate and at the periphery of the infrared color resistance structure. Therefore, the performing the fuzzy imaging operation according to the light intensity change sensed by the photosensitive structure includes: controlling the infrared light source to emit infrared light; performing the fuzzy imaging operation on an external scene based on a computational optical method, according to light intensity, sensed by the infrared light photosensitive element, of reflected infrared light obtained after infrared light emitted by the infrared light source is reflected by the external scene and passes through the infrared color resistance structure. For example, the specific details of the fuzzy imaging operation by using the display device can be referred to the common computational optical imaging method, which is not limited by the embodiments of the present disclosure. For example, the performing the fuzzy imaging operation according to the light intensity change sensed by the photosensitive structure further includes: continuously performing the fuzzy imaging operations on the external scene; and performing a floating touch detection operation or a floating motion recognition operation, according to the difference between the continuous fuzzy imaging results. For example, the external scene includes a human hand, and the floating touch detection operation or the floating motion recognition operation includes detecting or recognizing motions or gestures, such as clicking, sliding, swinging, etc. by using the human hand. The embodiments of the present disclosure include but are not limited to these cases.

For example, in the display device provided by some examples (for example, referring to the display device 1 illustrated in FIG. 3), the photosensitive structure of the display substrate (for example, referring to the display substrate 100 illustrated in FIG. 2) includes a visible light photosensitive element. Therefore, the performing the touch detection operation or the texture recognition operation according to the light intensity change sensed by the photosensitive structure includes: inserting a detection cycle between adjacent display cycles; during the detection cycle, controlling a plurality of sub-pixels of the display substrate to display a predetermined picture, and performing touch detection or texture recognition according to light intensity change of reflected light corresponding to the predetermined picture and sensed by the visible light photosensitive element before and after the display substrate is touched by an object. For example, a part of the display time period of the display cycle is divided as the detection cycle, and for example, the detection cycle is between adjacent display cycles; during the display cycle, the display substrate displays a predetermined picture, such as a monochrome picture, such as one selected from the group consisting of a red picture, a green picture and a blue picture; before the display substrate is touched by an object, the visible light photosensitive element (for example, used together with a filter) cannot sense the reflected light of the predetermined picture; after the display substrate is touched by an object, the visible light photosensitive element at the touch position can sense the reflected light of the predetermined picture reflected by the object (at the touch position, visible light in ambient light is blocked by the object); and therefore, the photosensitive structure can realize the touch detection operation according to the light intensity change sensed by the photosensitive structure. For example, further, in the case where the touch surface of an object (e.g., a finger or a palm) includes texture (e.g., fingerprint or palmprint), the reflected light of the predetermined picture reflected by ridges and valleys in the texture of the object can be sensed by a plurality of visible light photosensitive elements at the touch position, and the photosensitive structure can also realize the texture recognition operation (e.g., the fingerprint recognition operation or the palmprint recognition operation, etc.) according to the light intensity differences of the reflected light of the predetermined picture sensed by the plurality of visible light photosensitive elements at the touch position.

It should be noted that, in the case where the display device uses the infrared light photosensitive element for detection, the display operation and the detection operation (e.g., the touch detection operation, the texture recognition operation and the fuzzy imaging operation) of the display device can be performed at the same time without mutual influence; and in the case where the display device uses the visible light photosensitive element for detection, in order to avoid the influence of the display operation on the detection operation (e.g., the touch detection operation and the texture recognition operation), it is necessary to drive the display device in a time-sharing manner.

It should be noted that the display device can use a minority of photosensitive elements when performing the touch detection operation, and can use a majority of photosensitive elements when performing the fingerprint recognition operation.

It should be noted that the detection method by using the display device provided by the above examples is illustrative, and the embodiments of the present disclosure include but are not limited to this case.

Technical effects of the detection method by using the display device provided by the embodiments of the present disclosure can be referred to the related description of the display substrate in the above embodiments, and details will not be repeated here.

For the present disclosure, the following statements should be noted:

(1) The accompanying drawings related to the embodiment(s) of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or the size of a structure may be enlarged or narrowed, that is, the drawings are not drawn in a real scale.

(3) In case of no conflict, the embodiments of the present disclosure and the features in the embodiments can be combined with each other to obtain new embodiments.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A display substrate, comprising:
    a base substrate and at least one sub-pixel arranged on the base substrate,
    the at least one sub-pixel comprising a first region and a second region,
    the at least one sub-pixel comprising a light emitting element which is arranged in the first region, and a pixel circuit structure and a photosensitive structure which are arranged in the second region;
    wherein the pixel circuit structure and the photosensitive structure are stacked, and the photosensitive structure is closer to a light exiting side of the display substrate than the pixel circuit structure;
    the photosensitive structure comprises a photosensitive element and a switching transistor, the photosensitive element and the switching transistor are stacked and electrically connected to each other, and the photosensitive element is closer to the light exiting side of the display substrate than the switching transistor;
    the photosensitive element comprises a first electrode and a second electrode, and a PIN structure formed in a through hole of an insulating layer between the first electrode and the second electrode, the first electrode is a transparent electrode, the second electrode is an opaque electrode, and the first electrode is closer to the light exiting side of the display substrate than the second electrode;
    an orthographic projection of at least a channel region of the switching transistor on the base substrate is within an orthographic projection of the second electrode on the base substrate; and
    the second electrode of the photosensitive element covers the PIN structure formed in the through hole of the insulating layer, and directly covers part or all of the insulating layer located in the second region; and an orthographic projection of the PIN structure on the base substrate is within an orthographic projection of a part of the second electrode on the base substrate, and overlapped with a portion of an orthographic projection of one of source-drain electrodes of the switching transistor.

2. The display substrate according to claim 1, wherein the first electrode is a common electrode.

3. The display substrate according to claim 1, wherein an orthographic projection of at least a channel region of at least one transistor in the pixel circuit structure on the base substrate is within an orthographic projection of a source-drain metal layer where the source-drain electrodes of the switching transistor are located on the base substrate.

4. The display substrate according to claim 1, wherein an orthographic projection of at least a channel region of at least one transistor in the pixel circuit structure on the base substrate is within an orthographic projection of the second electrode on the base substrate.

5. The display substrate according to claim 1, wherein the photosensitive element in the at least one sub-pixel comprises at least one selected from the group consisting of an infrared light photosensitive element and a visible light photosensitive element.

6. The display substrate according to claim 5, wherein the photosensitive element comprises the visible light photosensitive element, the display substrate further comprises a filter layer arranged on one side of the visible light photosensitive element provided with the first electrode, and the filter layer is closer to the light exiting side of the display substrate than the first electrode; and
    the filter layer comprises at least one selected from the group consisting of a red filter layer, a green filter layer and a blue filter layer.

7. The display substrate according to claim 1, wherein the light emitting element comprises a third electrode and a fourth electrode, and the third electrode is closer to the light exiting side of the display substrate than the fourth electrode.

8. The display substrate according to claim 1, wherein a luminous color of the light emitting element is at least one selected from the group consisting of red, green, blue and infrared.

9. The display substrate according to claim 1, wherein the display substrate is a bottom emission type display substrate, and the photosensitive structure is at one side of the pixel circuit structure close to the base substrate.

10. A display device, comprising: a display substrate, and a package substrate cell-assembled with the display substrate;
wherein the display substrate comprises a base substrate and at least one sub-pixel arranged on the base substrate, the at least one sub-pixel comprises a first region and a second region, and the at least one sub-pixel comprises a light emitting element which is arranged in the first region, and a pixel circuit structure and a photosensitive structure which are arranged in the second region;
the pixel circuit structure and the photosensitive structure are stacked, and the photosensitive structure is closer to a light exiting side of the display substrate than the pixel circuit structure;
the photosensitive structure comprises a photosensitive element and a switching transistor, the photosensitive element and the switching transistor are stacked and electrically connected to each other, and the photosensitive element is closer to the light exiting side of the display substrate than the switching transistor;
the photosensitive element comprises a first electrode and a second electrode, and a PIN structure formed in a through hole of an insulating layer between the first electrode and second electrode, the first electrode is a transparent electrode, the second electrode is an opaque electrode, and the first electrode is closer to the light exiting side of the display substrate than the second electrode;
an orthographic projection of at least a channel region of the switching transistor on the base substrate is within an orthographic projection of the second electrode on the base substrate; and
the second electrode of the photosensitive element covers the PIN structure formed in the through hole of the insulating layer, and directly covers part or all of the insulating layer located in the second region; and an orthographic projection of the PIN structure on the base substrate is within an orthographic projection of a part of the second electrode on the base substrate, and overlapped with a portion of an orthographic projection of one of source-drain electrodes of the switching transistor.

11. The display device according to claim 10, further comprising: a control circuit, a detection circuit and a processing circuit;
wherein the control circuit is configured to control on and off of the switching transistor;
the detection circuit is configured to detect an electrical signal generated by the photosensitive element in a case where the switching transistor is turned on; and
the processing circuit is configured to process the electrical signal detected by the detection circuit to perform at least one selected from the group consisting of a touch detection operation, a fingerprint recognition operation and a fuzzy imaging operation.

12. The display device according to claim 10, further comprising:
an infrared color resistance structure with a predetermined pattern, which is arranged at the light exiting side of the display substrate; and
an infrared light source, arranged at one side of the infrared color resistance structure away from the display substrate, and arranged at a periphery of the infrared color resistance structure.

13. A detection method by using a display device, wherein the display device comprises a display substrate, the display substrate comprises at least one sub-pixel, the at least one sub-pixel comprises a first region and a second region, the at least one sub-pixel comprises a light emitting element which is arranged in the first region, and a pixel circuit structure and a photosensitive structure which are arranged in the second region, wherein the pixel circuit structure and the photosensitive structure are stacked, and the photosensitive structure is closer to a light exiting side of the display substrate than the pixel circuit structure; the photosensitive structure comprises a photosensitive element and a switching transistor, the photosensitive element including a first electrode and a second electrode, and a PIN structure formed in a through hole of an insulating layer between the first electrode and the second electrode, the first electrode is a transparent electrode, the second electrode is an opaque electrode, and the first electrode is closer to the light exiting side of the display substrate than the second electrode, an orthographic projection of at least a channel region of the switching transistor on a base substrate is within an orthographic projection of the second electrode on the base substrate; the second electrode of the photosensitive element covers the PIN structure formed in the through hole of the insulating layer, and directly covers part or all of the insulating layer located in the second region; and an orthographic projection of the PIN structure on the base substrate is within an orthographic projection of a part of the second electrode on the base substrate, and overlapped with a portion of an orthographic projection of one of source-drain electrodes of the switching transistor; and
the detection method comprises:
performing at least one selected from the group consisting of a touch detection operation, a texture recognition operation and a fuzzy imaging operation, according to a light intensity change sensed by the photosensitive structure in the display substrate.

14. The detection method according to claim 13, wherein the photosensitive element is an infrared light photosensitive element, and
the performing the touch detection operation according to the light intensity change sensed by the photosensitive structure comprises:
performing the touch detection operation, according to a light intensity change of infrared light in ambient light sensed by the infrared light photosensitive element before and after the display substrate is touched by an object.

15. The detection method according to claim 13, wherein the photosensitive element is an infrared light photosensitive element, the light emitting element in the display substrate comprises an infrared light emitting element, and
the performing the touch detection operation or the texture recognition operation according to the light intensity change sensed by the photosensitive structure comprises:
controlling the infrared light emitting element to emit infrared light; and
performing the touch detection operation or the texture recognition operation, according to the light intensity change of reflected light corresponding to infrared light emitted by the infrared light emitting element and sensed by the infrared light photosensitive element before and after the display substrate is touched by an object.

16. The detection method according to claim 13, wherein the photosensitive element is an infrared light photosensitive element, the light emitting element in the display substrate comprises an infrared light emitting element, and the performing the fuzzy imaging operation according to the light intensity change sensed by the photosensitive structure comprises:

controlling the infrared light emitting element to emit infrared light with different patterns; and performing the fuzzy imaging operation on an external scene based on a computational optical method, according to light intensity, sensed by the infrared light photosensitive element, of reflected infrared light obtained after the infrared light with different patterns is reflected by the external scene.

17. The detection method according to claim 13, wherein the photosensitive element is an infrared light photosensitive element, and the display device further comprises: an infrared color resistance structure with a predetermined pattern, which is arranged at the light exiting side of the display substrate; and an infrared light source, arranged at one side of the infrared color resistance structure away from the display substrate, and arranged at a periphery of the infrared color resistance structure;

the performing the fuzzy imaging operation according to the light intensity change sensed by the photosensitive structure comprises:

controlling the infrared light source to emit infrared light; and performing the fuzzy imaging operation on an external scene based on a computational optical method, according to light intensity, sensed by the infrared light photosensitive element, of reflected infrared light obtained after infrared light emitted by the infrared light source is reflected by the external scene and passes through the infrared color resistance structure.

18. The detection method according to claim 16, wherein the performing the fuzzy imaging operation according to the light intensity change sensed by the photosensitive element further comprises:

continuously performing the fuzzy imaging operations on the external scene; and performing a floating touch detection operation or a floating motion recognition operation, according to a difference between continuous fuzzy imaging results.

19. The detection method according to claim 13, wherein the photosensitive element is a visible light photosensitive element, and the performing the touch detection operation or the texture recognition operation according to the light intensity change sensed by the photosensitive structure comprises:

inserting a detection cycle between adjacent display cycles, and during the detection cycle, controlling a plurality of sub-pixels of the display substrate to display a predetermined picture, and performing the touch detection operation or the texture recognition operation, according to the light intensity change of reflected light corresponding to the predetermined picture and sensed by the visible light photosensitive element before and after the display substrate is touched by an object.

20. The detection method according to claim 17, wherein the performing the fuzzy imaging operation according to the light intensity change sensed by the photosensitive structure further comprises:

continuously performing the fuzzy imaging operations on the external scene; and performing a floating touch detection operation or a floating motion recognition operation, according to a difference between continuous fuzzy imaging results.

* * * * *